(12) United States Patent
Hashizume et al.

(10) Patent No.: US 8,593,068 B2
(45) Date of Patent: Nov. 26, 2013

(54) TWO-WIRE AC SWITCH

(75) Inventors: Shingo Hashizume, Kyoto (JP);
Ayanori Ikoshi, Kyoto (JP); Hiroto Yamagiwa, Hyogo (JP); Yasuhiro Uemoto, Toyama (JP); Manabu Yanagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 284 days.

(21) Appl. No.: 13/032,297

(22) Filed: Feb. 22, 2011

(65) Prior Publication Data

US 2011/0204807 A1 Aug. 25, 2011

(30) Foreign Application Priority Data

Feb. 23, 2010 (JP) ................................ 2010-037957

(51) Int. Cl.
*H05B 39/02* (2006.01)

(52) U.S. Cl.
USPC ................... 315/209 R; 315/200 R; 315/226

(58) Field of Classification Search
USPC ...... 315/209 R, 32, 72, 160, 172, 200 R, 205, 315/226, 291, 362
See application file for complete search history.

(56) References Cited

U.S. PATENT DOCUMENTS

| | | | |
|---|---|---|---|
| 7,283,344 B2 | 10/2007 | Mukai et al. | |
| 7,382,001 B2 | 6/2008 | Beach | |
| 7,465,997 B2 | 12/2008 | Kinzer et al. | |
| 7,550,781 B2 | 6/2009 | Kinzer et al. | |
| 7,595,680 B2 | 9/2009 | Morita et al. | |
| 2005/0189561 A1 | 9/2005 | Kinzer et al. | |
| 2008/0143421 A1 | 6/2008 | Yanagihara et al. | |
| 2009/0065810 A1 | 3/2009 | Honea et al. | |
| 2010/0097105 A1 | 4/2010 | Morita et al. | |
| 2010/0289421 A1* | 11/2010 | Imam et al. | 315/226 |

FOREIGN PATENT DOCUMENTS

JP 58-056477 12/1983
WO WO 2008/062800 A1 5/2008

* cited by examiner

*Primary Examiner* — Douglas W Owens
*Assistant Examiner* — Jianzi Chen
(74) *Attorney, Agent, or Firm* — McDermott Will & Emery LLP

(57) ABSTRACT

A two-wire AC switch suppressing heat from a bidirectional switch element inside the switch is provided. The two-wire AC switch 100a connected between an AC power supply 101 and a load 102 includes: a bidirectional switch element 103 which flows passing current bi-directionally, selects whether to flow or block the current, is connected in series with the AC power supply 101 and the load 102 to form a closed-loop circuit, and is made of a group-III nitride semiconductor; a full-wave rectifier 104 performing full-wave rectification on power supplied from the AC power supply 101; a power supply circuit 105 smoothing a voltage after the full-wave rectification to generate DC power; a first gate drive circuit 107 and a second gate drive circuit 108 each outputting a control signal to the bidirectional switch element 103; and a control circuit 106 controlling the first and second gate drive circuits 107 and 108.

19 Claims, 14 Drawing Sheets

TWO-WIRE AC SWITCH

BACKGROUND OF THE INVENTION (1) Field of the Invention

The present invention relates to two-wire AC switches, and more particularly to a two-wire AC switch including a bidirectional switch element made of a group-III nitride semiconductor.

(2) Description of the Related Art

Conventionally, mechanical switches have been widely used as two-wire AC switches to control lighting apparatuses, ventilating fans, and the like in houses. In recent years, there is a need for a bidirectional AC switch that conducts passing current bi-directionally to have high breakdown positive and negative voltages. High-function switches, such as a Triode AC (TRIAC) switch, which are made of semiconductors and have a photochromic function, a remote control function, a human sensing function, and the like, have therefore been commercialized. Japanese Examined Patent Application Publication No. 58-56477 discloses such a high-function switch.

FIG. 12 illustrates a schematic circuit diagram of a conventional two-wire AC switch 151 using a TRIAC as a primary switch. As illustrated in FIG. 12, the conventional two-wire AC switch 151 includes a TRIAC 150 and a drive circuit 149 that drives the TRIAC 150. The TRIAC 150 is connected in series with a commercial AC power supply 101 and a load 102, thereby forming a closed-loop circuit. The drive circuit 149 switches the TRIAC 150 ON/OFF to cause the commercial AC power supply 101 to supply or block power to the load 102.

However, when such a bidirectional switch element is a semiconductor device made of silicon (Si), the material limit of silicon makes it difficult to further reduce on-resistance of the bidirectional switch element. More specifically, as seen in a graph of TRIAC on-state characteristics in FIG. 13, the TRIAC 150 used as a bidirectional switch operates in the on-state in the same manner as the bipolar device that has the same on-stage characteristics as those of a silicon diode. Therefore, the TRIAC 150 has high on-resistance in a low current region. As a result, the two-wire AC switch using the TRIAC has a large conduction loss due to the on-resistance. For the above reason, there is a difficulty in using the conventional two-wire AC switch for a load of 200 W or more. Therefore, the use of the conventional two-wire AC switch imposes restrictions on power consumption of available loads.

SUMMARY OF THE INVENTION

In order to solve the above problem, an object of the present invention is to provide a two-wire AC switch capable of suppressing heat from an bidirectional switch element in the two-wire AC switch, and thereby switching ON/OFF a load that is connected to a commercial AC power supply and that is larger than loads which the conventional two-wire AC switches can switch.

In recent years, in order to overcome the material limit to reduce conduction loss, the use of semiconductor devices made of a group-III nitride semiconductor represented by GaN or a wide-gap semiconductor such as silicon carbide (SiC) have been examined. An example is disclosed in US patent application publication No. 2005/0189561. A wide-gap semiconductor has a dielectric breakdown electric field that is higher than that of silicon by approximately a single digit. Spontaneous polarization and piezoelectric polarization cause electric charges on a hetero-junction interface between aluminum gallium nitride (AlGaN) and gallium nitride (GaN). Thereby, even in the undoped state, a two-dimensional electron gas (2DEG) layer having a sheet carrier density of $1 \times 10^{13}$ cm$^{-2}$ or more and a high mobility of 1000 cm$^2$V/sec is formed. Therefore, an AlGaN/GaN hetero junction field-effect transistor (AlGaN/GaN-HFET) is expected to serve as a power switching transistor having low on-resistance and high breakdown voltage characteristics.

Especially when the AlGaN/GaN hetero junction is used to provide the semiconductor device with two gate electrodes, the single semiconductor device can work as a bidirectional switch element. In the circuit, the bidirectional switch element having the above structure is equivalent to the two transistors connected in series in the reverse directions with each other. As presented in the on-state characteristic comparison in FIG. 3, this bidirectional switch element has on-resistance lower than that of the conventional TRIAC. Thereby, the bidirectional switch element can control both the passing current flowing from the first ohmic electrode to the second ohmic electrode and the passing current flowing from the second ohmic electrode to the first ohmic electrode. Therefore, this bidirectional switch element, which is made of a group-III nitride semiconductor and has two gate electrodes, is smaller in size than the conventional bidirectional switches each formed by combining power transistors such as a conventional TRIAC, a power Metal-Oxide Semiconductor Field-Effect Transistor (MOSFET), and an Insulated Gate Bipolar Transistor (IGBT). In addition, the bidirectional switch element can reduce power consumption more than the conventional one. For these reasons, the bidirectional switch element has attracted attention.

In order to address the above, an object of the present invention is to provide a two-wire AC switch that employs good characteristics of a switch element made of a group-III nitride semiconductor. In accordance with an aspect of the present invention for achieving the object, there is provided a two-wire AC switch connected between an AC power supply and a load, the two-wire AC switch comprising: a bidirectional switch element connected in series with the AC power supply and the load to form a closed-loop circuit, the bidirectional switch element causing passing current to flow bi-directionally and selecting whether to flow or block the passing current, wherein the bidirectional switch element includes: a substrate; a semiconductor multilayer structure formed above the substrate, the semiconductor multilayer structure including a group-III nitride semiconductor; a first ohmic electrode and a second ohmic electrode which are formed above the semiconductor multilayer structure, the first ohmic electrode being electrically connected to one of the AC power supply and the load, and the second ohmic electrode being electrically connected to the other one of the AC power supply and the load; and a first gate electrode and a second gate electrode which are formed above the semiconductor multilayer structure and between the first ohmic electrode and the second ohmic electrode, the first gate electrode being provided close to the first ohmic electrode, and the second gate electrode being provided close to the second ohmic electrode; a full-wave rectifier connected between the first ohmic electrode and the second ohmic electrode to perform full-wave rectification on AC power supplied from the AC power supply; a power supply circuit which smoothes a voltage provided after the full-wave rectification by the full-wave rectifier to generate DC power; a drive circuit which receives the DC power from the power supply circuit, and outputs a first control signal to the first gate electrode and a second control signal to the second gate electrode; and a control circuit which receives the DC power from the power supply circuit, and controls the drive circuit to output the first control signal to the first gate electrode and the second control signal to the second gate electrode so as to turn the bidirectional switch element ON, so that the AC power supply supplies power to the load, the first control signal having a voltage higher than a threshold voltage of the first gate electrode, and the second control signal having a voltage higher than a threshold voltage of the second gate electrode.

With the above structure, the bidirectional switch element selecting whether or not to supply AC power is made of a group-III nitride semiconductor. Thereby, the two-wire AC switch including such a bidirectional switch element has low on-resistance, thereby suppressing heat. As a result, the two-wire AC switch can be used to switch loads larger than loads which the conventional two-wire AC switches can switch.

The drive circuit may output the first control signal to the first gate electrode via a resistance, and output the second control signal to the second gate electrode via a resistance. With the above structure, a resistance is inserted between the drive circuit and the first gate electrode and between the drive circuit and the second gate electrode. Thereby, it is possible to restrict current and a voltage of each of (a) a control signal outputted from the drive circuit to the first gate electrode and (b) a control signal outputted from the drive circuit to the second gate electrode. As a result, the suppression on variation of the control signals can stabilize switching operations of the two-wire AC switch. In addition, the above structure can prevent the bidirectional switch element from being damaged due to a surge voltage.

The drive circuit may output the first control signal to the first gate electrode, and output the second control signal to the second gate electrode, and each of the first control signal and the second control signal may be one of current and constant current. With the above structure, respective control signals which are current or constant current are outputted from the drive circuit to the first gate electrode and from the drive circuit to the second gate electrode, respectively. Thereby, even in a transient state where power is supplied to an overloaded load, the control signals of restricted current are outputted to the first gate electrode and the second gate electrode, respectively. As a result, switching operations of the two-wire AC switch can be stabilized.

The control circuit may control the drive circuit to (i) apply a voltage as a control signal to one of the first and second gate electrodes, the voltage being higher than the threshold voltage of the one of the first and second gate electrodes, the one of the first and second gate electrodes being close to one of the first and second ohmic electrodes which has a potential higher than a potential of the other, and (ii) apply, after applying the voltage, an other voltage as a control signal to the other one of the first and second gate electrodes, the other voltage being higher than the threshold voltage of the other one of the first and second gate electrodes, so that the bidirectional switch element is turned ON. With the above structure, the two-wire AC switch is switched ON at a timing of providing a signal to one of the first and second gate electrodes which has a lower potential for turning the bidirectional switch element ON. Thereby, the two-wire AC switch can be switched ON at a timing precisely more than a timing of applying control signals at the same time to both the first and second gate electrodes.

The substrate may be grounded, and may have a fixed potential. Each of the above structures can stabilize a potential of the substrate of the bidirectional switch element. In addition, each of the above structures can eliminate electric insulation between the bidirectional switch element and heatsink when the heatsink is provided to the bidirectional switch element. Moreover, each of the above structures can suppress noises.

The two-wire AC switch may further include a substrate terminal electrically connected to the substrate; and two diodes connected in a direction in which passing current flows from the substrate terminal to the first ohmic electrode and the second ohmic electrode, one of the two diodes being connected between the substrate terminal and the first ohmic electrode, and the other one of the two diodes being connected between the substrate terminal and the second ohmic electrode. With the above structure, a potential of the substrate of the bidirectional switch element is close to a potential of one of the two switch terminals (the first and second ohmic electrodes) which has a lower potential than a potential of the other switch terminal. As a result, it is possible to stabilize control operations using one of the control terminals (the first and second gate electrodes) which has a voltage lower than the other control terminal in the bidirectional switch element.

The two-wire AC switch may further include a substrate terminal electrically connected to the substrate; and two diodes connected in a direction in which passing current flows from the first ohmic electrode and the second ohmic electrode to the substrate terminal, one of the two diodes being connected between the substrate terminal and the first ohmic electrode, and the other one of the two diodes being connected between the substrate terminal and the second ohmic electrode. With the above structure, a potential of the substrate of the bidirectional switch element is close to a potential of one of the two switch terminals (the first and ohmic electrodes) which has a potential higher than a potential of the other switch terminal. As a result, it is possible to stabilize control operations using one of the control terminals (the first and second gate electrodes) which has a voltage higher than the other control terminal in the bidirectional switch element.

The two-wire AC switch according to the present invention includes a bidirectional switch element made of a group-III nitride semiconductor, so as to reduce loss caused by on-resistance. As a result, the two-wire AC switch can suppress of heat from the bidirectional switch element to offer stable switching operations. Therefore, the two-wire AC switch is suitable to be equipped to walls of houses.

In addition, the two-wire AC switch according to the present invention can switch a relatively large load ON/OFF, and also perform the switching operation without restrictions on the target load.

Further Information About Technical Background to This Application

The disclosure of Japanese Patent Application No. 2010-037957 filed on Feb. 23, 2010 including specification, drawings and claims is incorporated herein by reference in its entirety.

BRIEF DESCRIPTION OF THE DRAWINGS

These and other objects, advantages and features of the present invention will become apparent from the following description thereof taken in conjunction with the accompanying drawings that illustrate specific embodiments of the present invention. In the Drawings.

DESCRIPTION OF THE PREFERRED EMBODIMENT(S)

The following describes two-wire AC switches according to embodiments of the present invention with reference to the drawings.

(First Embodiment)

Figure 1:
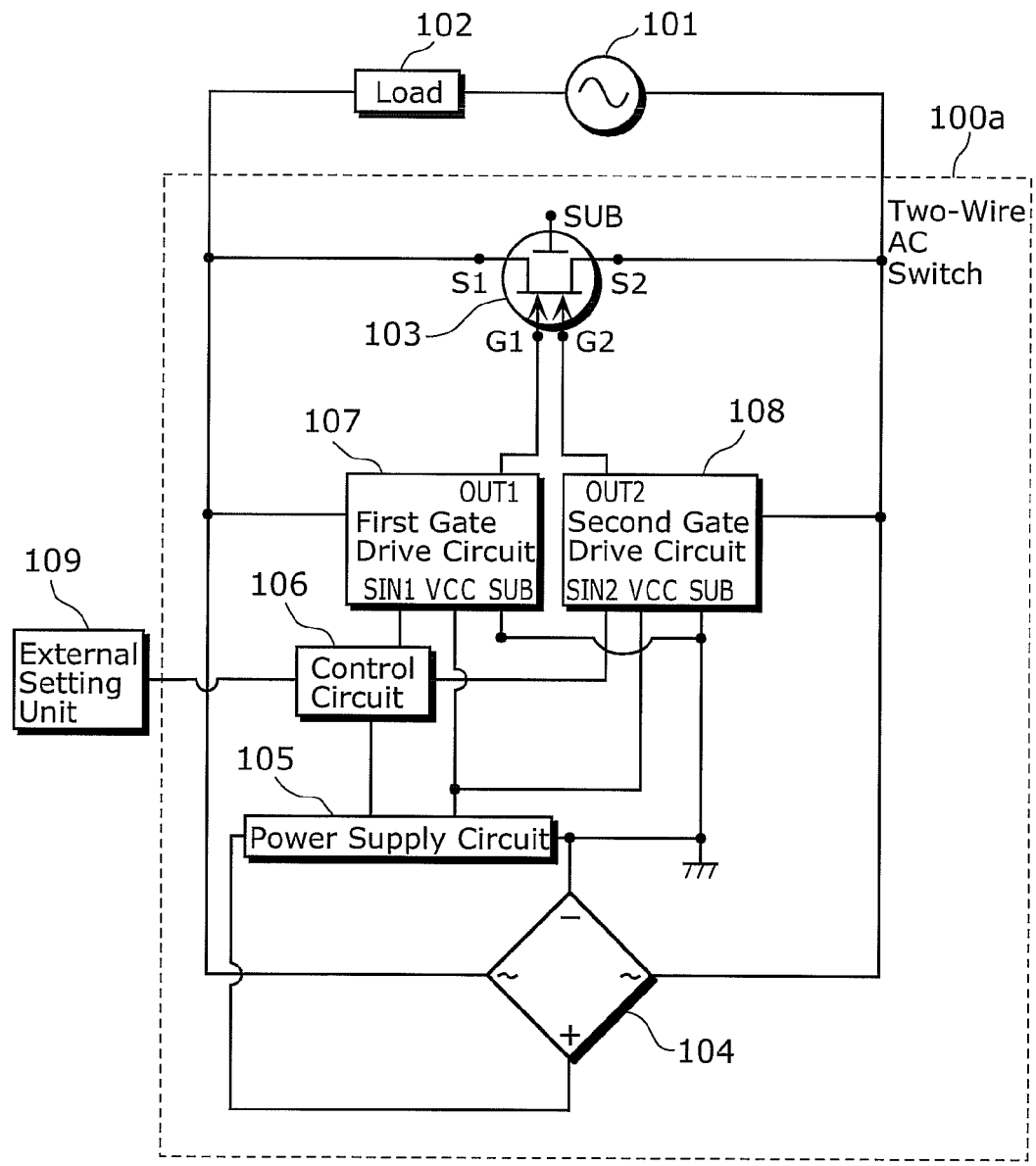
FIG. 1 is a circuit diagram of a two-wire AC switch according to a first embodiment of the present invention.

FIG. 1 illustrates a circuit structure of a two-wire AC switch 100a according to the first embodiment of the present invention. The two-wire AC switch 100a is an AC switch connected between a commercial AC power supply 101 and a load 102. An example of the load 102 is a lighting apparatus. The two-wire AC switch 100a includes a bidirectional switch element 103, a full-wave rectifier 104, a power supply circuit 105, drive circuits (a first gate drive circuit 107 and a second gate drive circuit 108), and a control circuit 106.

As illustrated in FIG. 1, the bidirectional switch element 103 made of a group-III nitride semiconductor has two gates. With the structure, the bidirectional switch element 103 causes passing current to flow bi-directionally, and also selects (switches) whether to flow or block the current. The bidirectional switch element 103 has switch terminals S1 and S2, control terminals G1 and G2, and a substrate terminal SUB. Each of the switch terminals S1 and S2 is to be switched ON or OFF (conduction or non-conduction). Each of the control terminals G1 and G2 is connected to a corresponding one of the two gates, so as to select whether to flow or block the current. The substrate terminal SUB is electrically-connected to the substrate of the bidirectional switch element 103. Here, the commercial AC power supply 101, the load 102, and the bidirectional switch element 103 (the switch terminals S1 and S2) are connected in series with one another to form a closed-loop circuit.

The full-wave rectifier 104 is connected between the switch terminal S1 and the switch terminal S2. The full-wave rectifier 104 performs full-wave rectification on AC supplied from the commercial AC power supply 101. An example of the full-wave rectifier 104 is a diode bridge rectifier.

The power supply circuit 105 smoothes a voltage applied from the full-wave rectifier 104 after the full-wave rectification to generate DC power. Then, the power supply circuit 105 supplies the power to the first gate drive circuit 107, the second gate drive circuit 108, and the control circuit 106, and the like.

The control circuit 106 controls the first gate drive circuit 107 and the second gate drive circuit 108 in the following way. In order to supply power from the commercial AC power supply 101 to the load 102, the control circuit 106 controls each of the first gate drive circuit 107 and the second gate drive circuit 108 to output a control signal to a corresponding one of the control terminals G1 and G2 of the bidirectional switch element 103. The control signal has a voltage higher than a threshold voltage of a gate corresponding to the corresponding control terminal. As a result, the bidirectional switch element 103 is turned ON. On the other hand, in order to block the power supply from the commercial AC power supply 101 to the load 102, the control circuit 106 controls each of the first gate drive circuit 107 and the second gate drive circuit 108 to output a control signal to the corresponding control terminal G1 or G2. The control signal has a voltage lower than the threshold voltage of the corresponding gate. As a result, the bidirectional switch element 103 is turned OFF.

More specifically, the control circuit 106 receives, from an external setting unit 109, a signal indicating whether or not to supply power from the commercial AC power supply 101 to the load 102. Based on the received signal, the control circuit 106 outputs a controlling signal to an input terminal SIN1 of the first gate drive circuit 107 and an input terminal SIN2 of the second gate drive circuit 108.

Based on the controlling signal provided from the control circuit 106, the first gate drive circuit 107 outputs the previously-described control signal from an output terminal OU1 of the first gate drive circuit 107 to the control terminal G1 of the bidirectional switch element 103. Likewise, based on the control signal provided from the control circuit 106, the second gate drive circuit 108 outputs the previously-described control signal from an output terminal OU2 of the second gate drive circuit 108 to the control terminal G2 of the bidirectional switch element 103. Thereby, the switching operation of the bidirectional switch element 103 is controlled. The above is explained in more detail. The following is the process to supply power to the load 102. Both the first gate drive circuit 107 and the second gate drive circuit 108 apply voltages to the control terminal G1 and the control terminal G2, respectively. Here, each of the voltages is higher than a threshold voltage of the bidirectional switch element 103 (gates of the bidirectional switch element 103, more precisely). Thereby, a path between the switch terminal S1 and the switch terminal S2 of the bidirectional switch element 103 becomes in a conducted state. As a result, power is supplied from the commercial AC power supply 101 to the load 102. Next, the process to block the power supply is described. In this process, at least one of the first gate drive circuit 107 and the second gate drive circuit 108 applies a voltage to the control terminal G1 and/or the control terminal G2. Here, the voltage is lower than the above-mentioned threshold voltage. Thereby, a path between the switch terminal S1 and the switch terminal S2 of the bidirectional switch element 103 becomes in a conducted state. As a result, the power supply to the load 102 is blocked. As described above, the two-wire AC switch using the bidirectional switch element 103 made of a group-III nitride semiconductor is implemented. This two-wire AC switch can significantly reduce on-resistance, and thereby switch a relatively large load ON or OFF.

Figure 2:
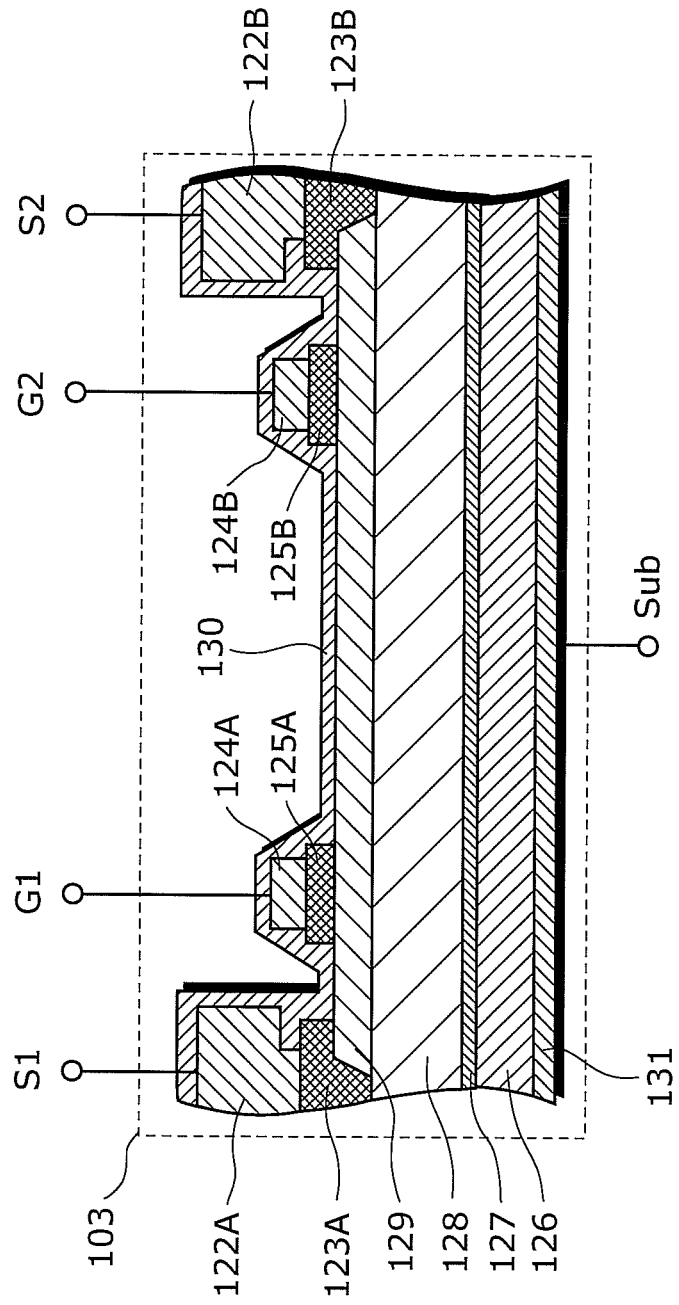
FIG. 2 is a cross-sectional view of a bidirectional switch element included in the two-wire AC switch according to the first embodiment of the present invention.

The following describes the bidirectional switch element 103 made of a group-III nitride semiconductor, which is used in the two-wire AC switch according to the first embodiment, in more detail. First, a structure of the bidirectional switch element 103 is described. FIG. 2 is a cross-sectional view of the bidirectional switch element 103.

Figure 3:
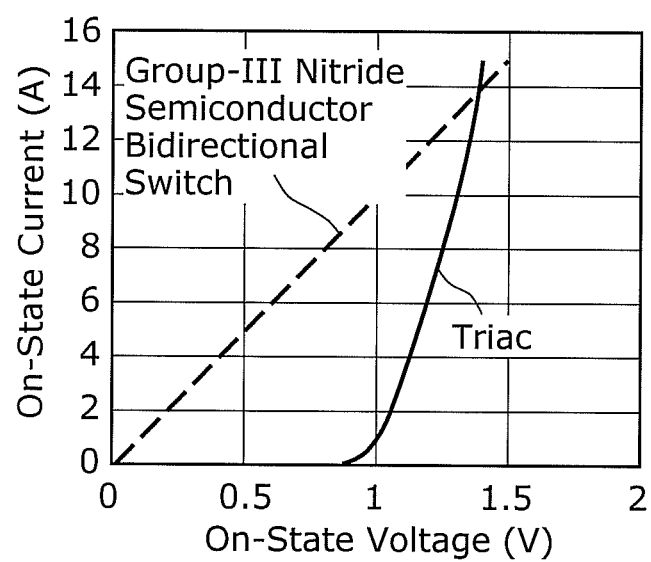
FIG. 3 is a graph plotting comparison of on-state characteristics between (a) the bidirectional switch element which is made of a group-III nitride semiconductor and included in the two-wire AC switch according to the first embodiment of the present invention and (b) a TRIAC.

As illustrated in FIG. 2, the bidirectional switch element 103 includes a buffer layer 127 and a semiconductor multilayer structure. The buffer layer 127 is formed on a conductive silicon (Si) substrate 126 to have a thickness of approximately 1 μm. The semiconductor multilayer structure consisting of a first semiconductor layer 128 and a second semiconductor layer 129 is formed on the buffer layer 127. The buffer layer 127 is made of aluminum nitride (AlN) layers and gallium nitride (GaN) layers which are alternately stacked. Each of the nitride layers has a thickness of approximately 10 nm. The semiconductor multilayer structure consists of the first semiconductor layer 128 and the second semiconductor layer 129 which are sequentially stacked on the substrate 126. The second semiconductor layer 129 has a band gap greater than that of the first semiconductor layer 128. In the first embodiment, the first semiconductor layer 128 is an undoped gallium nitride (GaN) layer having a thickness of approximately 2 μm. The second semiconductor layer 129 is an n-type aluminum gallium nitride (AlGaN) layer having a thickness of approximately 20 nm. The above-described structure allows the bidirectional switch element 103 to have extremely low on-resistance, in other words, allows the two-wire AC switch 100a to have extremely low on-resistance, as presented in FIG. 3 that is a graph plotting comparison of on-state characteristics between (a) the group-III nitride semiconductor bidirectional switch element (the bidirectional switch element) according to the first embodiment and (b) the conventional TRIAC.

Spontaneous polarization and piezoelectric polarization cause electric charges on and around a hetero-junction interface between the first semiconductor layer 128 made of GaN and the second semiconductor layer 129 made of AlGaN. The electric charges form a channel region that is a two-dimensional electron gas (2DEG) layer having a sheet carrier density of $1 \times 10^{13}$ cm$^{-2}$ or more and a high mobility of 1000 cm$^2$V/sec.

On the semiconductor multilayer structure, namely, on the semiconductor layer 128 and the semiconductor layer 129, a first ohmic electrode 123A and a second ohmic electrode 123B are formed being spaced apart from each other. Each of the first ohmic electrode 123A and the second ohmic electrode 123B, which is a stack of a titanium (Ti) layer and an aluminum (Al) layer, is in ohmic contact with the above-described channel region. In the example of FIG. 2, in order to reduce contact resistance, a part of the second semiconductor layer 129 is removed and the first semiconductor layer 128 is entrenched by a depth of approximately 40 nm. Thereby, each of the first ohmic electrode 123A and the second ohmic electrode 123B contacts the surface of the first semiconductor layer 128 and the surface of the second semiconductor layer 129. It is also possible that the first ohmic electrode 123A and the second ohmic electrode 123B are formed on the second semiconductor layer 129.

On the first ohmic electrode 123A, a first ohmic electrode line 122A made of gold (Au) and Ti is formed. The first ohmic electrode line 122A is electrically-connected to the first ohmic electrode 123A. Likewise, on the second ohmic electrode 123B, a second ohmic electrode line 122B made of Au and Ti is formed. The second ohmic electrode line 122B is electrically-connected to the second ohmic electrode 123B.

In the area between the first ohmic electrode 123A and the second ohmic electrode 123B on the second semiconductor layer 129, a first p-type semiconductor layer (first gate) 125A and a second p-type semiconductor layer (second gate) 125B are selectively formed being spaced apart. They serve as the two gates of the bidirectional switch element 103. On the first p-type semiconductor layer 125A, a first gate electrode 124A is formed. On the second p-type semiconductor layer 125B, a second gate electrode 124B is formed. Each of the first gate electrode 124A and the second gate electrode 124B is a multilayer structure of palladium (Pd) and Au. The first gate electrode 124A and the second gate electrode 124B are in ohmic contact with the first p-type semiconductor layer 125A and the second p-type semiconductor layer 125B, respectively.

A protection film 130 made of silicon nitride (SiN) is formed to cover the first ohmic electrode line 122A, the first ohmic electrode 123A, the second semiconductor layer 129, the first p-type semiconductor layer 125A, the first gate electrode 124A, the second p-type semiconductor layer 125B, the second gate electrode 124B, the second ohmic electrode 123B, and the second ohmic electrode line 122B.

On the rear surface of the silicon substrate 126, a rear-surface electrode 131 is formed. A rear-surface electrode 131 has a multilayer structure of nickel (Ni), chrome (Cr), and silver (Ag). A thickness of the rear-surface electrode 131 is approximately 800 nm. The rear-surface electrode 131 is in ohmic contact with the silicon substrate 126.

Each of the first p-type semiconductor layer 125A and the second p-type semiconductor layer 125B has a thickness of approximately 300 nm, and made of p-type GaN doped with magnesium (Mg). The second semiconductor layer 129 and each of the first and second p-type semiconductor layers 125A and 125B form pn junctions. Thereby, if a voltage between the first ohmic electrode 123A and the first gate electrode 124A is, for example, 0 V or lower, a depletion layer is expanded from the first p-type semiconductor layer 125A to the channel region. This can block the current flowing in the channel region. Likewise, if a voltage between the second ohmic electrode 123B and the second gate electrode 124B is, for example, 0 V or lower, a depletion layer is expanded from the second p-type semiconductor layer 125B to the channel region. This can block the current flowing in the channel region. The above-described structure provides a switch element having two gates to perform so-called normally-off operation. A distance between the first p-type semiconductor layer 125A and the second p-type semiconductor layer 125B is designed enough to tolerate a maximum voltage applied to the first ohmic electrode 123A and the second ohmic electrode 123B.

In FIG. 2, a terminal S1 connected to the first ohmic electrode 123A corresponds to the switch terminal S1 in FIG. 1, a terminal G1 connected to the first gate electrode 124A corresponds to the control terminal G1 in FIG. 1, a terminal G2 connected to the second gate electrode 124B corresponds to the control terminal G2 in FIG. 1, and a terminal S2 connected to the second ohmic electrode 123B corresponds to the switch terminal S2 in FIG. 1. In addition, a terminal Sub connected to the rear-surface electrode 131 corresponds to the substrate terminal SUB in FIG. 1.

Figure 4:
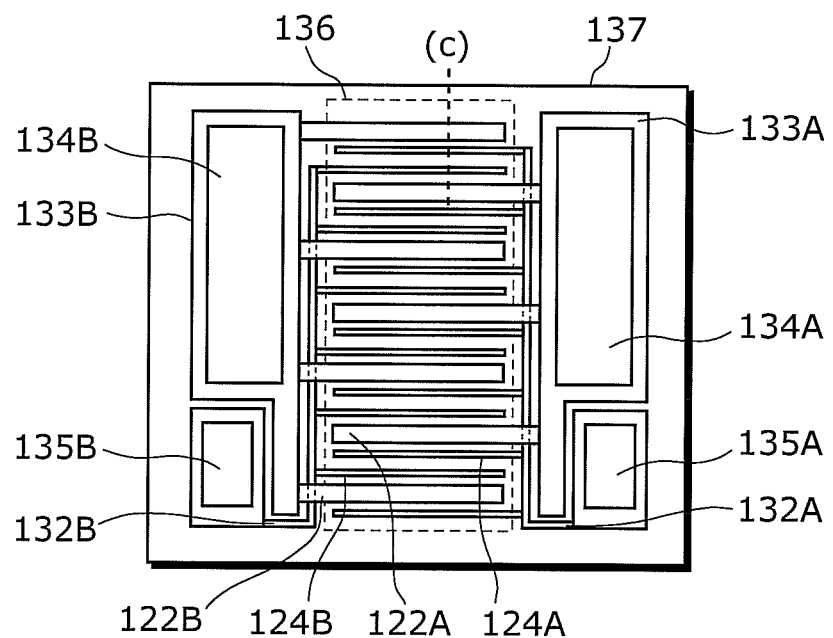
FIG. 4 is a schematic view of a layout of the bidirectional switch element included in the two-wire AC switch according to the first embodiment of the present invention.

FIG. 4 is a layout view of a surface of a chip (bidirectional switch chip 137) of the bidirectional switch element 103. On a right-side region of the surface of the bidirectional switch chip 137, there are arranged a first ohmic electrode line 133A, a first ohmic electrode pad 134A, a first gate line 132A, and a first gate electrode pad 135A. The first ohmic electrode pad 134A is formed on the top surface of the first ohmic electrode line 133A. The first gate line 132A is electrically-connected to the first gate electrode 124A illustrated in FIG. 2. The first gate electrode pad 135A is formed on the top surface of the first gate line 132A.

On the other hand, on a left-side region of the surface of the bidirectional switch chip 137, there are arranged a second ohmic electrode line 133B, a second ohmic electrode pad 134B, a second gate line 132B, and a second gate electrode pad 135B. The second ohmic electrode pad 134B is formed on the top surface of the second ohmic electrode line 133B. The second gate line 132B is electrically-connected to the second gate electrode 124B illustrated in FIG. 2. The second gate electrode pad 135B is formed on the top surface of the second gate line 132B.

Moreover, on a center region of the surface of the bidirectional switch chip 137, there are arranged the second ohmic electrode lines 122B, the first gate electrodes 124A, the second gate electrodes 124B, and the first ohmic electrode lines 122A. The second ohmic electrode lines 122B are line fingers that are electrically connected to the second ohmic electrode line 133B and extend from the second ohmic electrode line 133B onto the center region. The first gate electrodes 124A are electrode fingers that are electrically connected to the first gate line 132A and extend from the first gate line 132A onto the center region. The second gate electrodes 124B are electrode fingers that are electrically connected to the second gate line 132B and extend from the second gate line 132B onto the center region. The first ohmic electrode lines 122A are line fingers that are electrically connected to the first ohmic electrode line 133A and extend from the first ohmic electrode line 133A onto the center region. FIG. 4 also illustrates an active region 136 that is the above-described channel region, on the center region of the surface of the bidirectional switch chip 137.

A cross-sectional view of the bidirectional switch chip 137 taken along a dotted line (c) on the center region of the surface of the bidirectional switch chip 137 is illustrated in FIG. 2.

Figure 5:
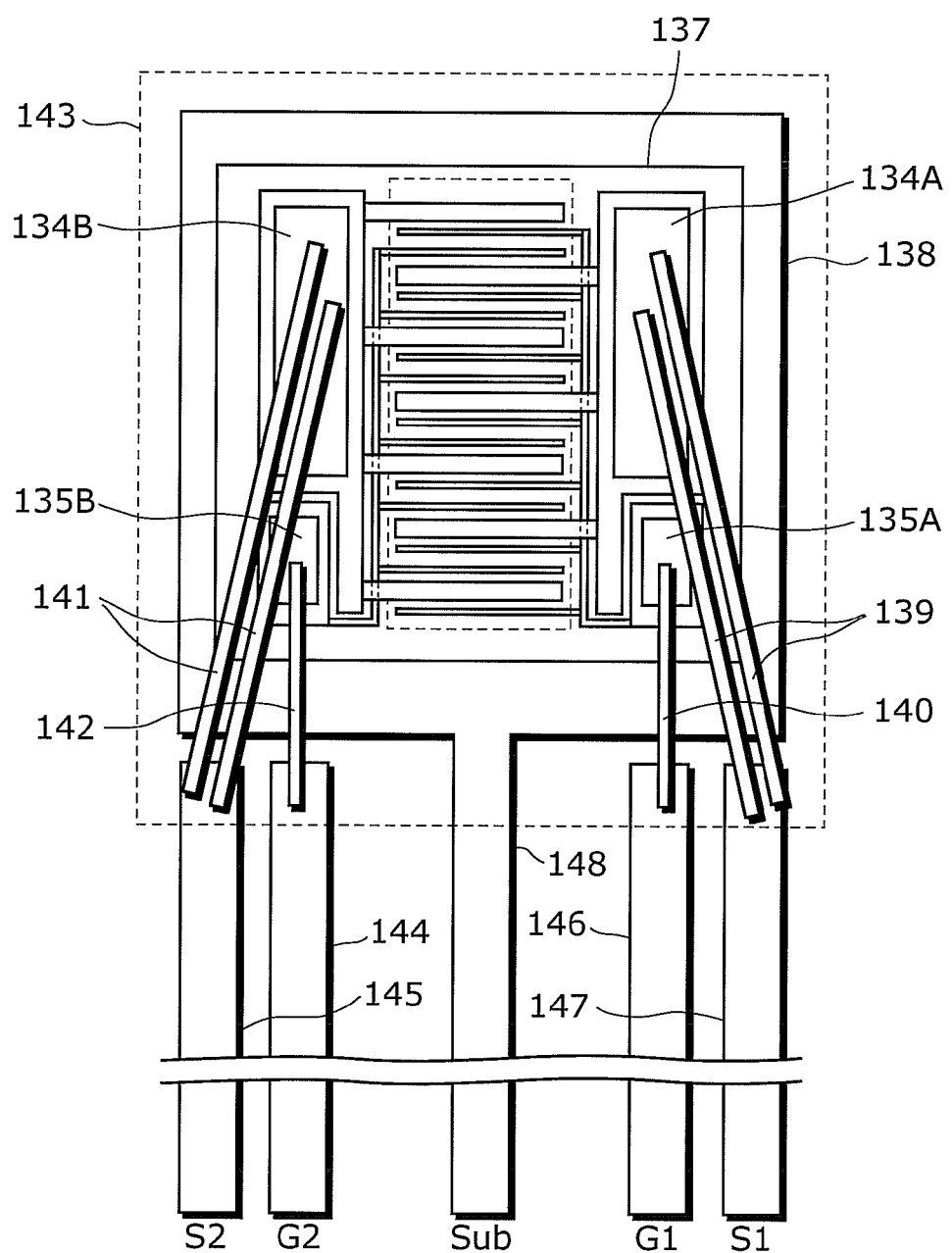
FIG. 5 is a schematic view of a package of the bidirectional switch element included in the two-wire AC switch according to the first embodiment of the present invention.

FIG. 5 is an implementation example of a package of the bidirectional switch element 103. FIG. 5 illustrates how to connect the pads 134A, 135A, 134B, and 135B, and leads 144 to 147 to one another. The pads 134A, 135A, 134B, and 135B are arranged on the surface of the bidirectional switch chip 137 that is fixed on a die pad 138. The leads 144 to 147 are used for the terminals (the switch terminals S1 and S2, the control terminals G1 and G2, and the substrate terminal SUB) illustrated in FIGS. 1 and 2. More specifically, the first ohmic electrode pad 134A is connected to the lead 147 for the switch terminal S1 using two wires 139. The first gate electrode pad 135A is connected to the lead 146 for the control terminal G1 using a wire 140. The second gate electrode pad 135B is connected to the lead 144 for the control terminal G1 using a wire 142. The second ohmic electrode pad 134B is connected to the lead 145 for the switch terminal S2 using two wires 141.

In addition, the die pad 138 is connected to the lead 148 for the substrate terminal SUB. Moreover, each base of the die pad 138, the bidirectional switch chip 137, the wires 139 to 142, and the leads 144 to 148 is molded by a resin 143.

The following describes a principal of the switching operation performed by the bidirectional switch element 103 having the above structure according to the first embodiment. First, how to achieve an OFF state is explained. The first gate drive circuit 107 illustrated in FIG. 1 applies, between the control terminal G1 and the switch terminal S1, a potential lower than a threshold voltage of the first gate electrode 124A, so that a depletion layer is expanded under the first gate electrode 124A illustrated in FIG. 2. Likewise, the second gate drive circuit 108 applies, between the control terminal G2 and the switch terminal S2, a potential lower than a threshold voltage of the second gate electrode 124B, so that a depletion layer is expanded under the second gate electrode 124B illustrated in FIG. 2. This prevents passing current from flowing in any directions between the switch terminal S1 as the first ohmic electrode 123A and the switch terminal S2 as the second ohmic electrode 123B. Thereby, the current is blocked between the switch terminal S1 and the switch terminal S2 in the bidirectional switch element 103. As a result, power cannot be supplied from the commercial AC power supply 101 to the load 102, namely, an OFF state is achieved.

On the other hand, in order to achieve an ON state, the first gate drive circuit 107 applies, between the control terminal G1 and the switch terminal S1, a potential equal to or higher than the threshold voltage of the first gate electrode 124A, so that a depletion layer is not expanded under the first gate electrode 124A illustrated in FIG. 2. Likewise, the second gate drive circuit 108 applies, between the control terminal G2 and the switch terminal S2, a potential equal to or higher than the threshold voltage of the second gate electrode 124B, so that the depletion layer is not expanded under the second gate electrode 124B illustrated in FIG. 2. This allows passing current to flow in both directions between the switch terminal S1 as the first ohmic electrode 123A and the switch terminal S2 as the second ohmic electrode 123B. Thereby, a path between the switch terminal S1 and the switch terminal S2 in the bidirectional switch element 103 becomes in a conducted state. As a result, power can be supplied from the commercial AC power supply 101 to the load 102, namely, an ON state is achieved.

Here, the above principle is applied to the two-wire AC switch 100a illustrated in FIG. 1. The application of a voltage equal to or higher than the threshold voltage to between the control terminal G1 and the switch terminal S1 and between the control terminal G2 and the switch terminal S2 of the bidirectional switch element 103 enables power supply from the commercial AC power supply 101 to the load 102. On the other hand, the application of a voltage lower than the threshold voltage to between the control terminal G1 and the switch terminal S1 and between the control terminal G2 and the switch terminal S2 blocks the power supply from the commercial AC power supply 101 to the load 102. As described above, the load 102 connected to the commercial AC power supply 101 can be selectively switched ON or OFF.

Next, description is given for a method of providing signals between the control terminal G1 and the switch terminal S1 and between the control terminal G2 and the switch terminal S2 of the bidirectional switch element 103. In order to turn the bidirectional switch element 1030N, it is necessary to apply a voltage equal to or higher than the threshold value between the control terminal G1 and the switch terminal S1 and also apply a voltage equal to or higher than the threshold value between the control terminal G2 and the switch terminal S2. It is possible to perform both of the voltage application processes substantially at the same time. However, a preferable method of applying voltages is described below.

More specifically, in order to turn the bidirectional switch element 103 ON from OFF, the following is performed. First, a voltage equal to or higher than the threshold voltage is applied to one of the control terminals that is close to one having a higher potential of the switch terminals S1 and S2. Then, after a predetermined time period, a voltage equal to or higher than the threshold voltage is applied to the other control terminal that is close to one having a lower potential of the switch terminals S1 and S2. On the other hand, in order to turn the bidirectional switch element 103 OFF from ON, the following is performed. First, a voltage lower than the threshold voltage is applied to one of the control terminals that is close to one having a lower potential of the switch terminals S1 and S2. Then, after a predetermined time period, a voltage lower than the threshold voltage is applied to the other control terminal that is close to one having a higher potential of the switch terminals S1 and S2.

For example, if a potential of the switch terminal S2 is higher than that of the switch terminal S1, the following is performed to turn the bidirectional switch element 103 ON from OFF. First, a voltage equal to or higher than the threshold voltage is applied between the control terminal G2 and the switch terminal S2. Then, after a predetermined time period, a voltage equal to or higher than the threshold voltage is applied between the control terminal G1 and the switch terminal S1. Thereby, both of the control terminals are provided with voltages equal to or higher than the threshold voltage. As a result, the bidirectional switch element 103 is turned ON. On the other hand, in order to turn the bidirectional switch element 103 OFF from ON, first, a voltage lower than the threshold voltage is applied to between the control terminal G1, which is close to the switch terminal S1 having a lower potential, and the switch terminal S1. Then, after a predetermined time period, a voltage lower than the threshold voltage is applied to between the control terminal G2 and the switch terminal S2.

The above-described method of providing signals (voltages) between the control terminal G1 and the switch terminal S1 and between the control terminal G2 and the switch terminal S2 can control (decide) the bidirectional switch element 103 to be turned ON or OFF, substantially at a timing of applying a potential (voltage) to one having a lower potential of the control terminals. Thereby, the above-described method can control the bidirectional switch element 103 precisely more than a method of applying control voltages to the two control terminals at the same time. The method of providing signals between the control terminal G1 and the switch terminal S1 and between the control terminal G2 and the switch terminal S2 of the bidirectional switch element 103 offer the same effects in other embodiments illustrated in FIGS. 6 to 11.

(Second Embodiment)

Figure 6:
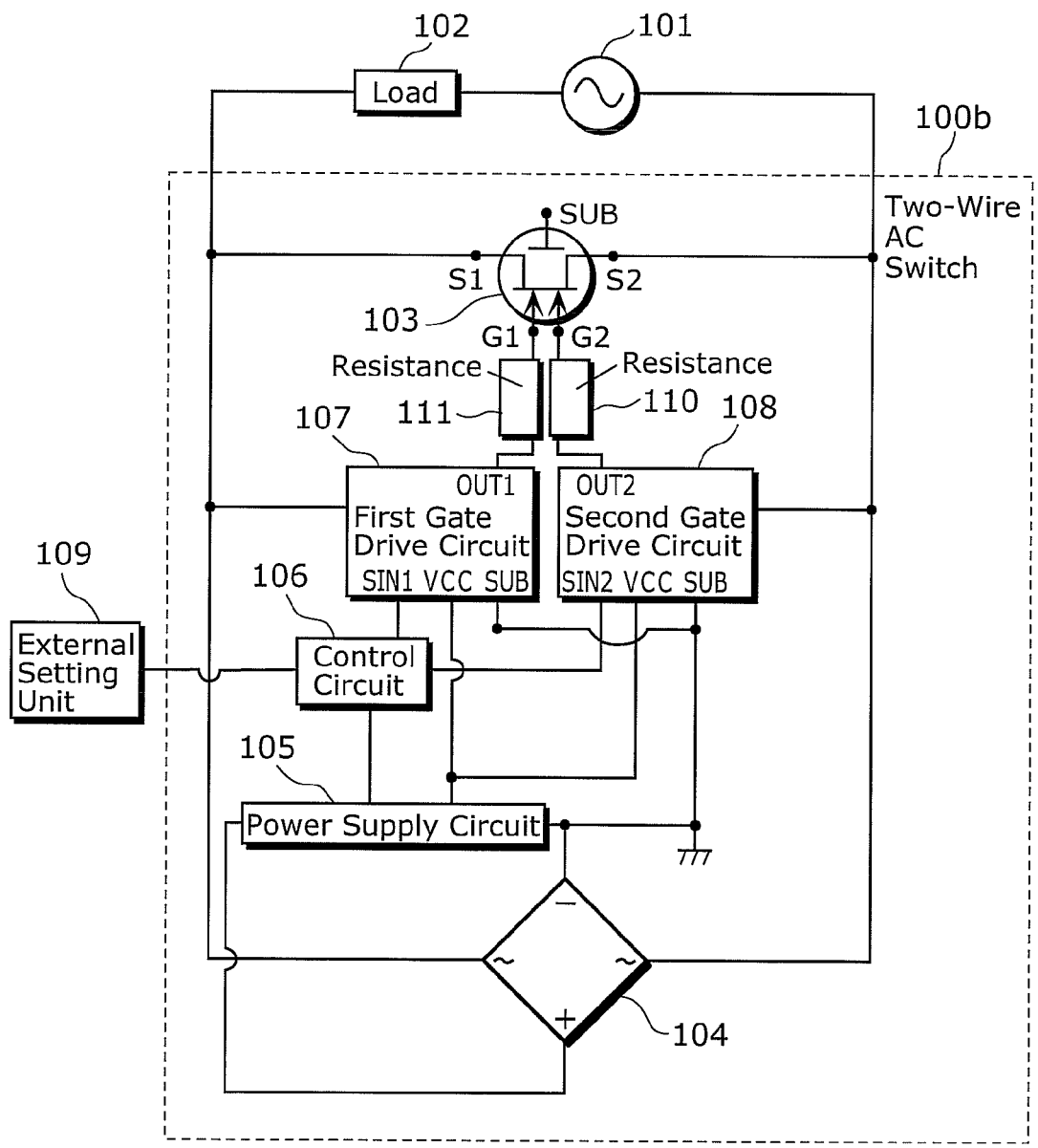
FIG. 6 is a circuit diagram of a two-wire AC switch including resistances each inserted between a bidirectional switch element and a corresponding one of first and second gate drive circuits, according to a second embodiment of the present invention.

FIG. 6 is a diagram of a circuit structure of a two-wire AC switch 100*b* according to the second embodiment of the present invention. The two-wire AC switch 100*b* in FIG. 6 differs from the two-wire AC switch 100*a* in FIG. 1 in that a resistance 111 is inserted between the control terminal G1 and the first gate drive circuit 107 and a resistance 110 is inserted between the control terminal G2 and the second gate drive circuit 108. The two-wire AC switch 100*b* having the above-described structure has the following advantages in a transient state from when a voltage equal to or higher than the threshold value is applied to the control terminals G1 and G2 of the bidirectional switch element 103 until when power is supplied to the load 102. In the transient state, the two-wire AC switch 100*b* can prevent variation of (i) current and a voltage provided from the control terminal G1 to the switch terminal S1, and (ii) current and a voltage provided from the control terminal G2 to the switch terminal S2. In addition, the two-wire AC switch 100*b* can protect the bidirectional switch element 103 from being damaged due to a surge voltage applied from other source.

(Third Embodiment)

Figure 7:
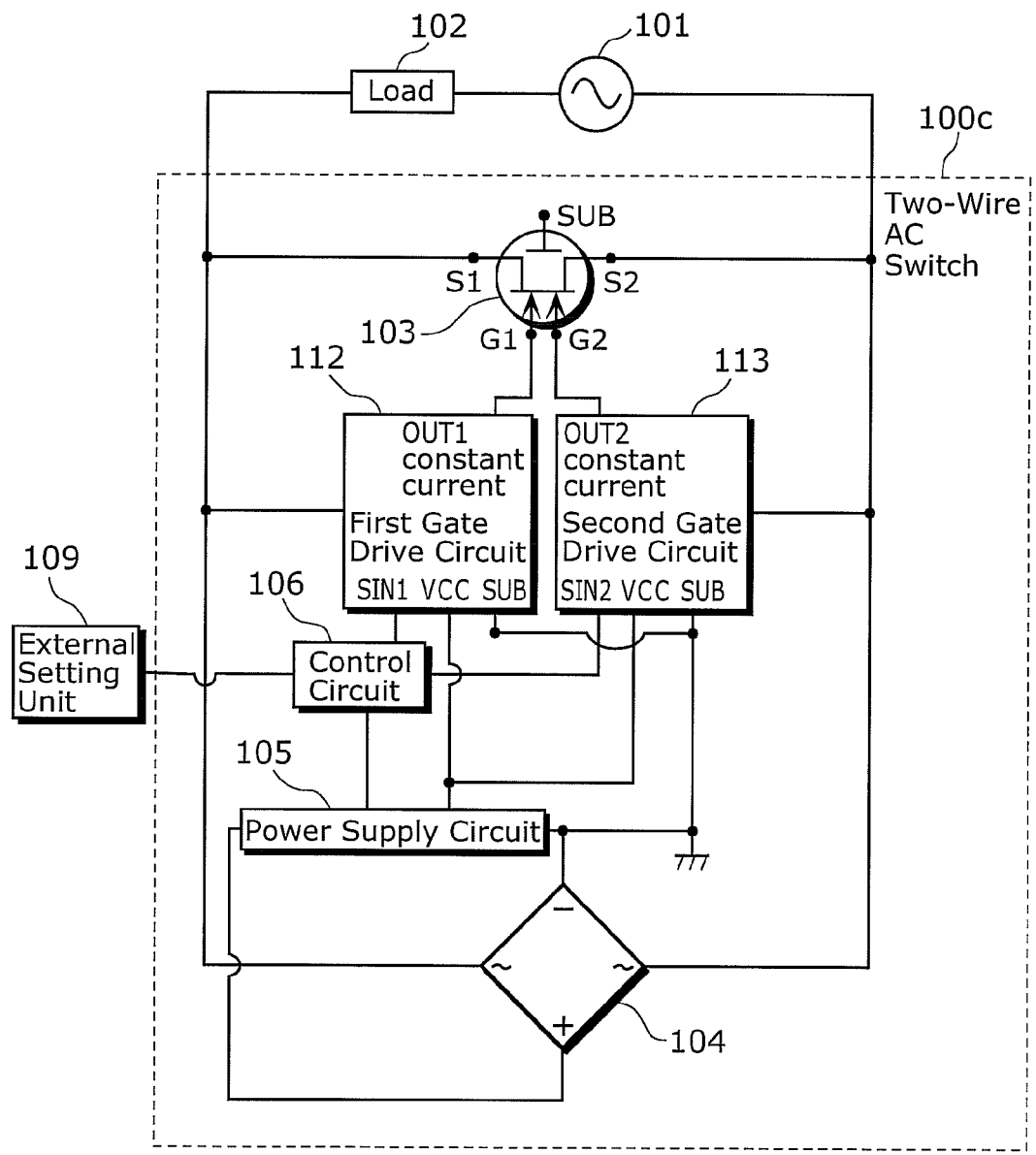
FIG. 7 is a circuit diagram of a two-wire AC switch using current or constant current to drive gates of a bidirectional switch element, according to a third embodiment of the present invention.

FIG. 7 is a diagram of a circuit structure of a two-wire AC switch 100*c* according to the third embodiment of the present invention. The two-wire AC switch 100*c* in FIG. 7 differs from the two-wire AC switch 100*a* in FIG. 1 in that the first gate drive circuit 107 is replaced by a first gate drive circuit 112 and the second gate drive circuit 108 is replaced by a second gate drive circuit 113. The first gate drive circuit 112 is a current source for supplying passing current to the control terminal G1. The second gate drive circuit 113 is a power supply for causing passing current to flow to the control terminal G2. The two-wire AC switch 100*c* having the above-described structure makes constant current flow to the control terminals G1 and G2 to turn the bidirectional switch element 1030N. Therefore, the current and voltages provided to the control terminals G1 and G2 are stabilized in the transient state where power is supplied to the load 102 that is overloaded.

FIGS. 8A to 11 are diagrams of circuit structures of two-wire AC switches 100*d*-1 to 100*g* according to other embodiments of the present invention. FIGS. 8A to 11 illustrate various implementations of how to fix a potential of the substrate terminal SUB of the bidirectional switch element 103. In the bidirectional switch element 103 in each the two-wire AC switches 100*a* to 100*c* illustrated in FIGS. 1, 6, and 7, the substrate terminal SUB is in a floating state having a variable potential.

(Fourth Embodiment and its Variation)

Figure 8A:
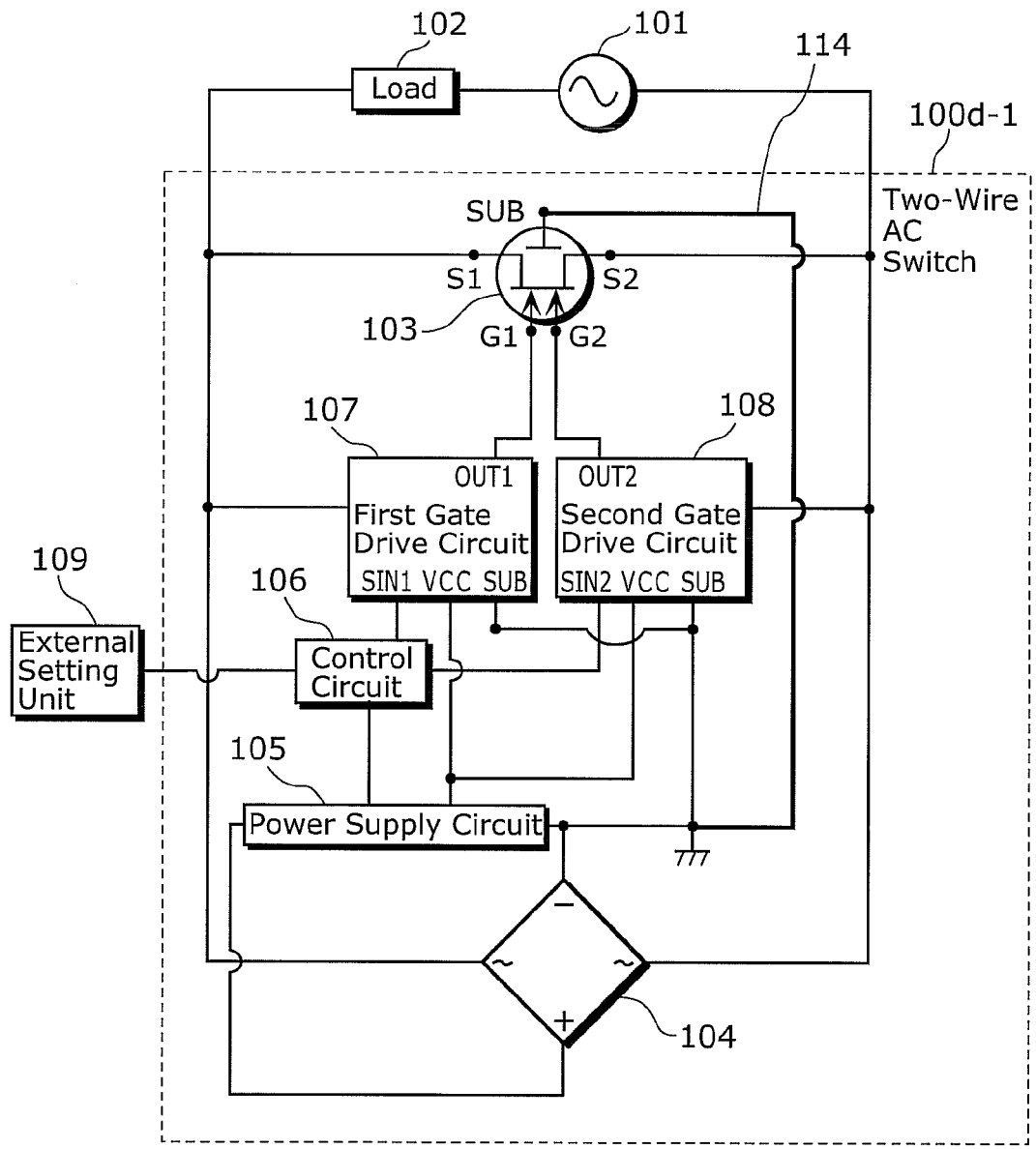
FIG. 8A is a circuit diagram of a two-wire AC switch including a bidirectional switch element having a grounded substrate potential, according to a fourth embodiment of the present invention.
Figure 8B:
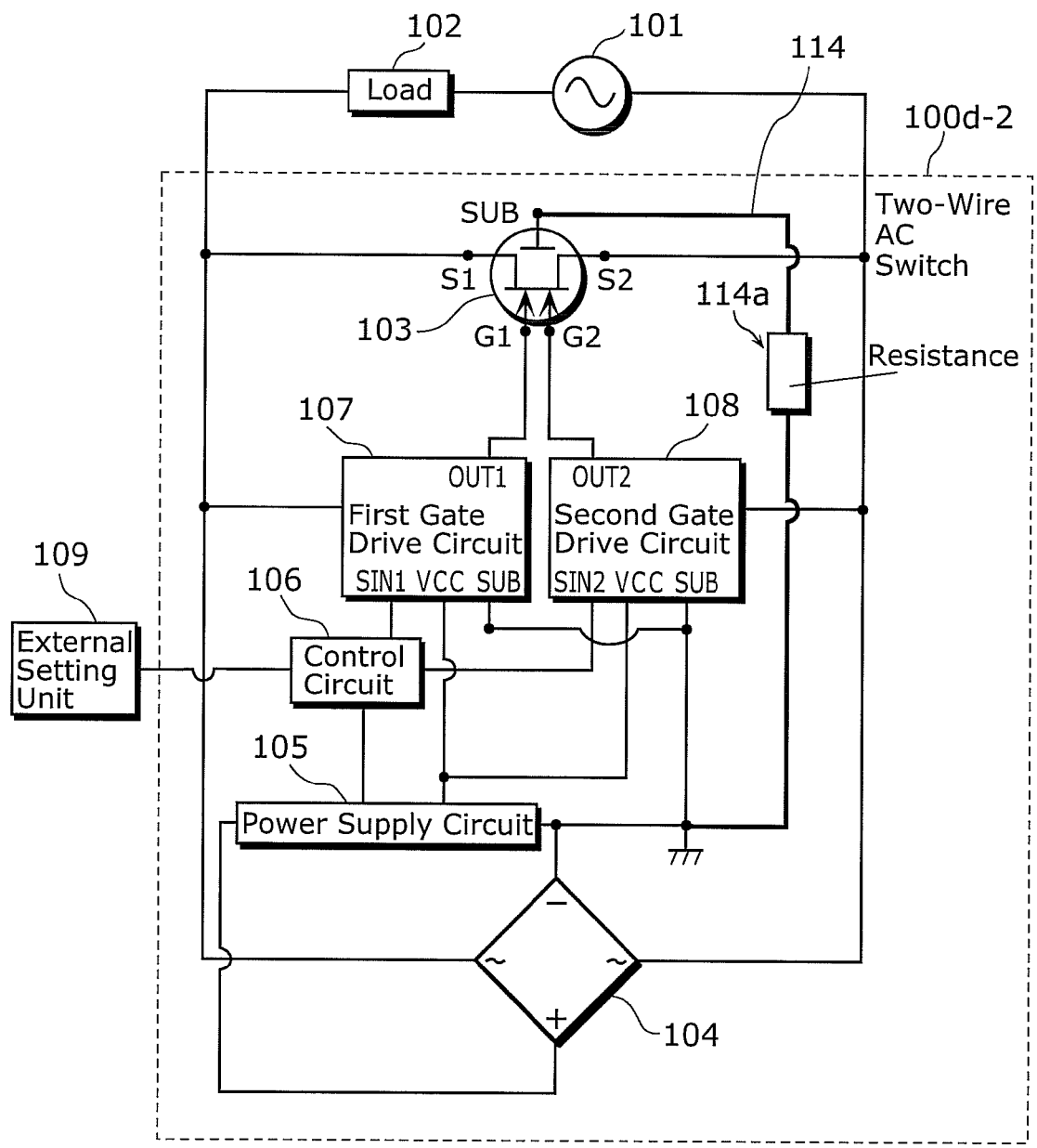
FIG. 8B is a circuit diagram of a two-wire AC switch including a bidirectional switch element having a grounded substrate potential, according to a variation of the fourth embodiment of the present invention.

FIG. 8A is a diagram of a circuit structure of a two-wire AC switch 100*d*-1 according to the fourth embodiment of the present invention. The two-wire AC switch 100*d*-1 in FIG. 8A differs from the two-wire AC switch 100*a* in FIG. 1 in that the substrate terminal SUB of the bidirectional switch element 103 is grounded. More specifically, in the example illustrated in FIG. 8A, the substrate terminal SUB is connected using a line 114 to a common grounded part among the first gate drive circuit 107, the second gate drive circuit 108, the control circuit 106, and the power supply circuit 105. The grounded substrate terminal SUB can stabilize a potential of the substrate of the bidirectional switch element 103. Moreover, when the bidirectional switch element 103 is provided with heatsink, the above structure does not need electric insulation between them. As a result, noise can be prevented. FIG. 8B illustrates a two-wire AC switch 100*d*-2 according to a variation of the fourth embodiment of the present invention. The two-wire AC switch 100*d*-2 in FIG. 8B differs from the two-wire AC switch 100*d*-1 in FIG. 8A in that a resistance 114*a* is inserted in the line 114 for grounding the substrate terminal SUB. The resistance 114*a* is provided to protect the two-wire AC switch 100*d*-2 from a surge voltage. This structure of the two-wire AC switch 100*d*-2 causes the substrate terminal SUB can stabilize the substrate terminal SUB, as the two-wire AC switch 100*d*-1 in FIG. 8A does. It should be noted that the method of grounding the substrate terminal SUB is not limited to the above. Any other method of grounding the substrate terminal SUB can offer the same effects.

(Fifth Embodiment and its Variation)

Figure 9A:
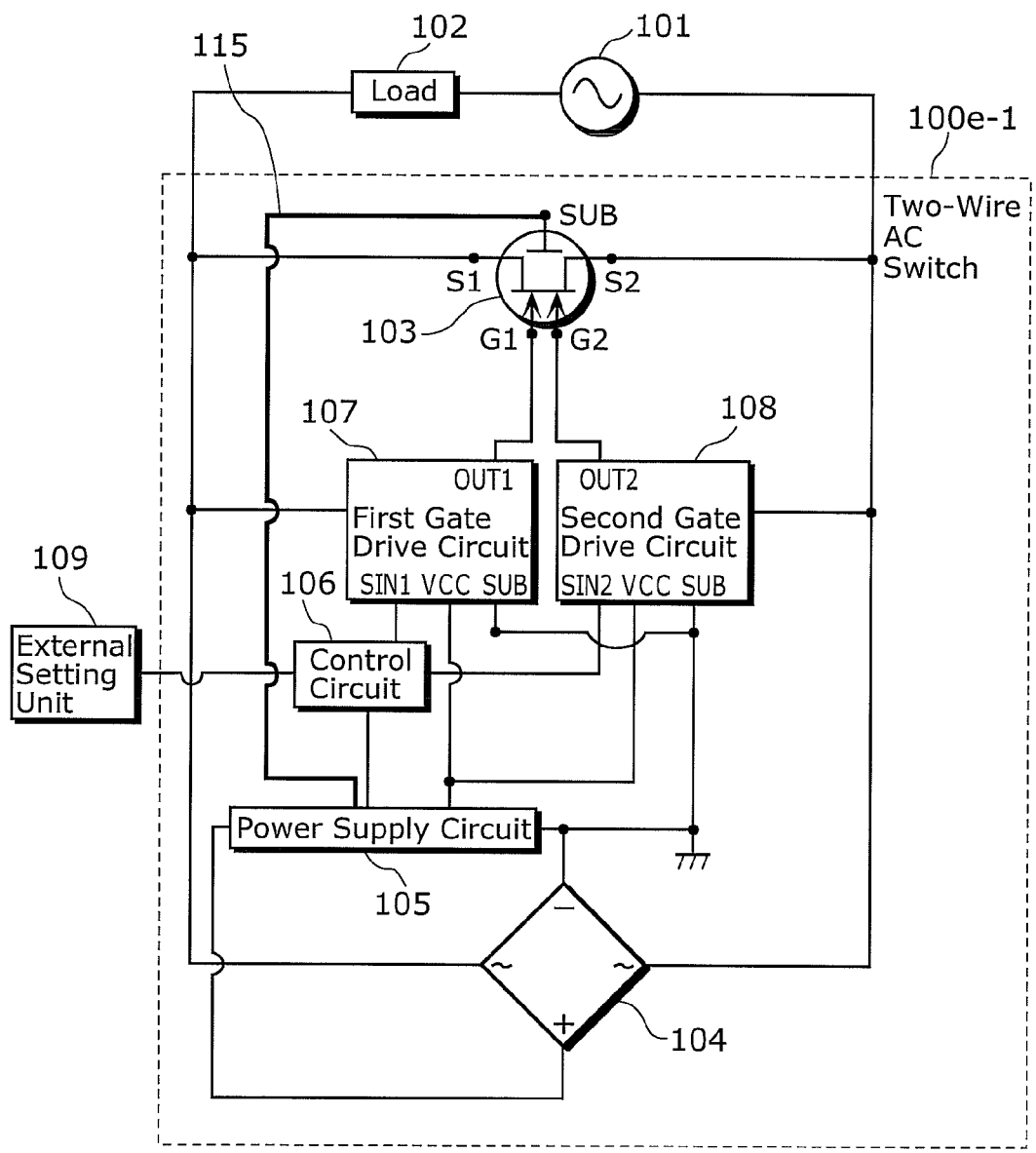
FIG. 9A is a circuit diagram of a two-wire AC switch including a bidirectional switch element having a desired fixed substrate potential, according to a fifth embodiment of the present invention.
Figure 9B:
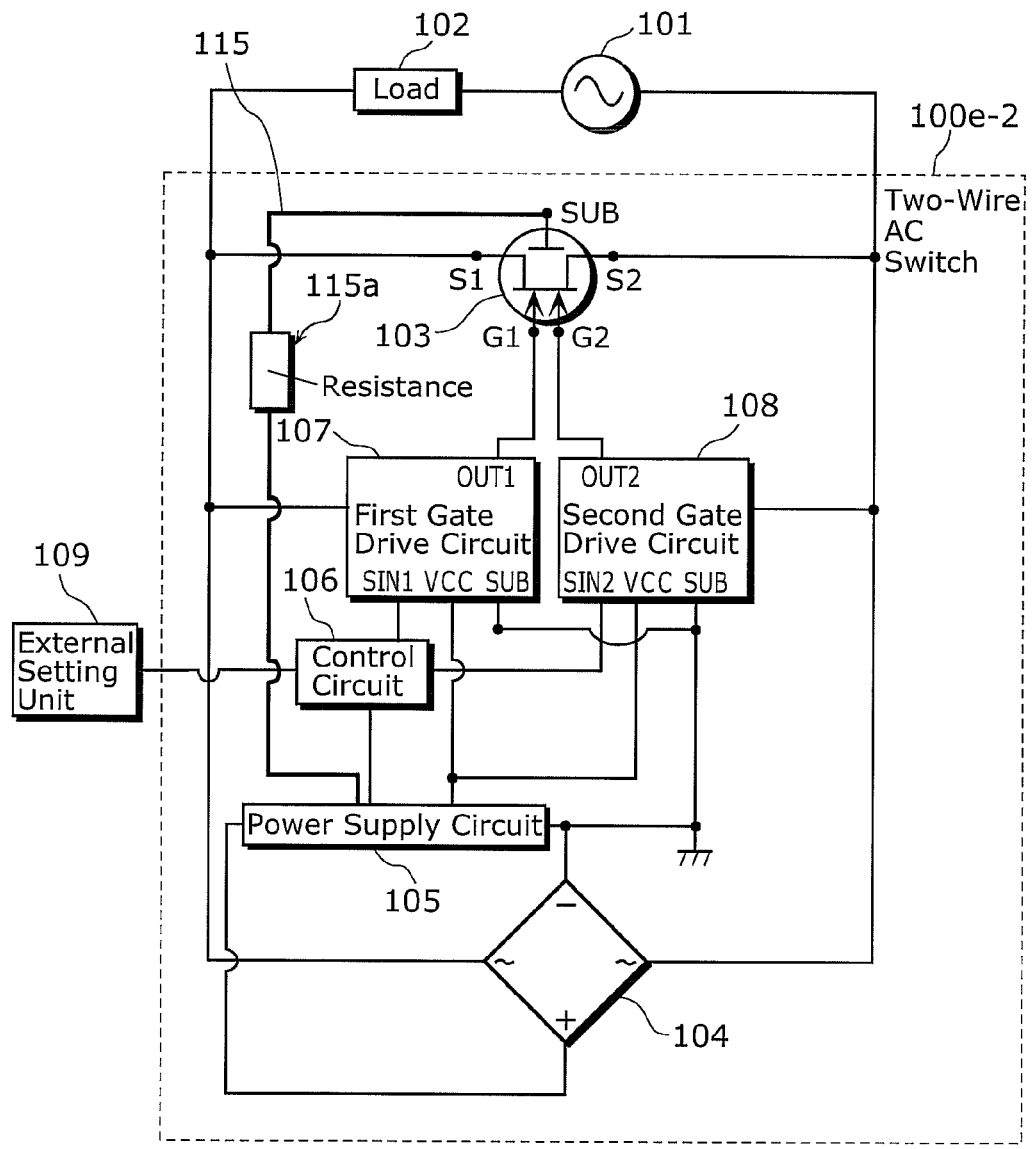
FIG. 9B is a circuit diagram of a two-wire AC switch including a bidirectional switch element having a desired fixed substrate potential, according to a variation of the fifth embodiment of the present invention.

FIG. 9A is a diagram of a circuit structure of a two-wire AC switch 100e-1 according to the fifth embodiment of the present invention. The two-wire AC switch 100e-1 in FIG. 9A differs from the two-wire AC switch 100a in FIG. 1 in that the substrate terminal SUB of the bidirectional switch element 103 has a desired fixed potential (a predetermined DC potential, for example). More specifically, the substrate terminal SUB is connected using a line 115 to a terminal of the power supply circuit 105, and the terminal has a desired potential. Such substrate terminal SUB having a desired fixed potential can stabilize a potential of the substrate of the bidirectional switch element 103, even if the bidirectional switch element 103 is provided with heatsink requiring electric insulation. FIG. 9B illustrates a two-wire AC switch 100e-2 according to a variation of the fifth embodiment of the present invention. The two-wire AC switch 100e-2 in FIG. 9B differs from the two-wire AC switch 100e-1 in FIG. 9A in that a resistance 115a is inserted in the line 115 connecting the substrate terminal SUB to the desired potential terminal. The resistance 115a is provided to protect the two-wire AC switch 100e-2 from a surge voltage. This structure of the two-wire AC switch 100e-2 can stabilize the substrate terminal SUB, as the two-wire AC switch 100e-1 in FIG. 9A does.

(Sixth Embodiment)

Figure 10:
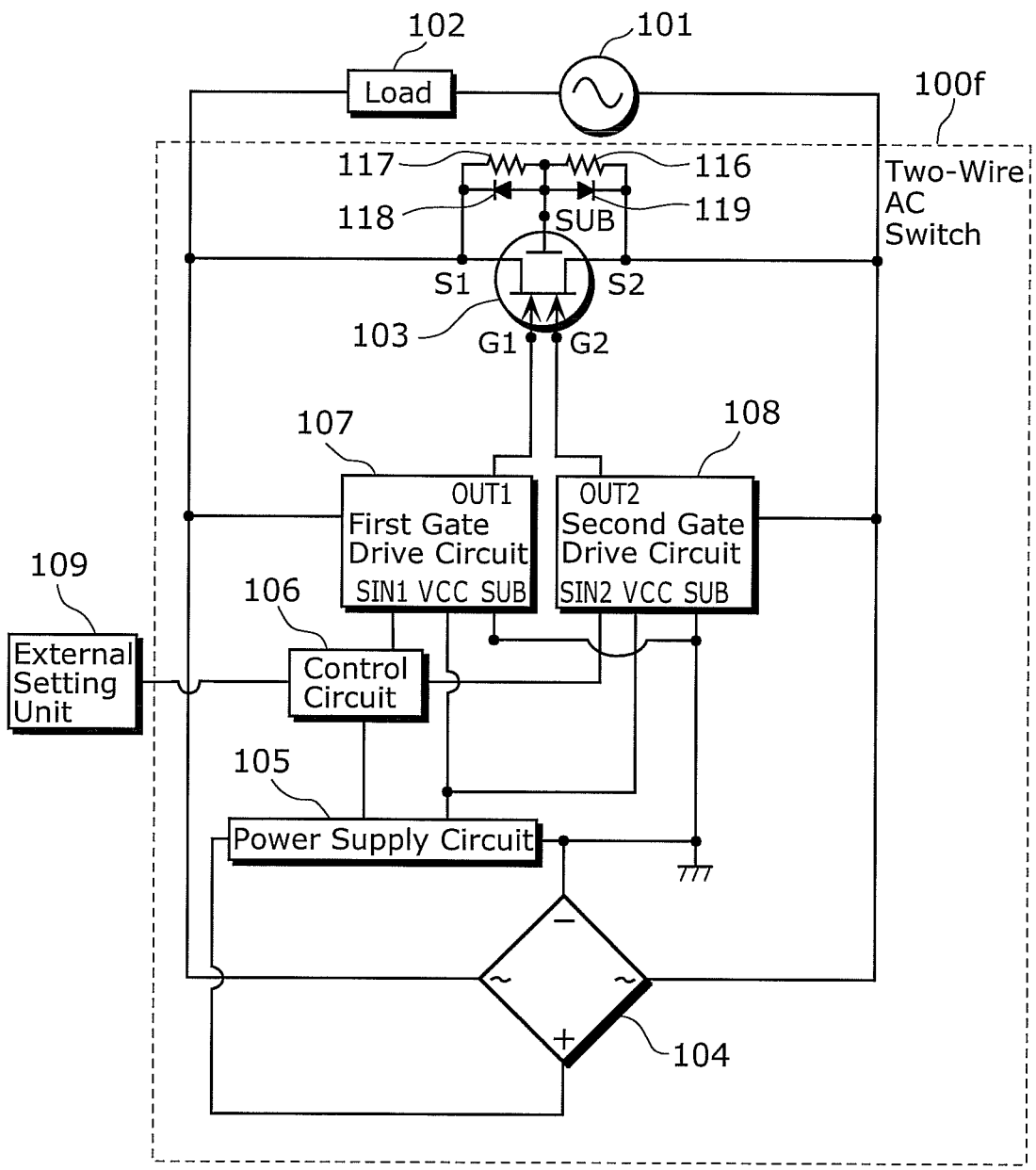
FIG. 10 is a circuit diagram of a two-wire AC switch including a bidirectional switch element having a substrate potential that is close to a lower one of potentials of a commercial two-wire AC power supply, according to a sixth embodiment of the present invention.

FIG. 10 is a diagram of a circuit structure of a two-wire AC switch 100f according to the sixth embodiment of the present invention. The two-wire AC switch 100f in FIG. 10 differs from the two-wire AC switch 100a in FIG. 1 in that the substrate terminal SUB of the bidirectional switch element 103 has a fixed potential that is close to a lower one of potentials of a two-wire AC voltage. More specifically, in the example of FIG. 10, a diode 118 and a resistance 117 are connected in parallel with each other between the substrate terminal SUB and switch terminal 51, and a diode 119 and a resistance 116 are connected in parallel with each other between the substrate terminal SUB and the switch terminal S2. The above-described structure causes the substrate terminal SUB to have a fixed potential that is close to a lower one of the potentials of the two-wire AC voltage. The two-wire AC switch 100f having the structure can therefore offer stable control operations using the control terminal having a lower potential of the bidirectional switch element 103. It should be note that the method of fixing the potential of the substrate terminal SUB of the bidirectional switch element 103 to a potential that is close to a lower one of the potentials of the two-wire AC voltage may be any other methods.

(Seventh Embodiment)

Figure 11:
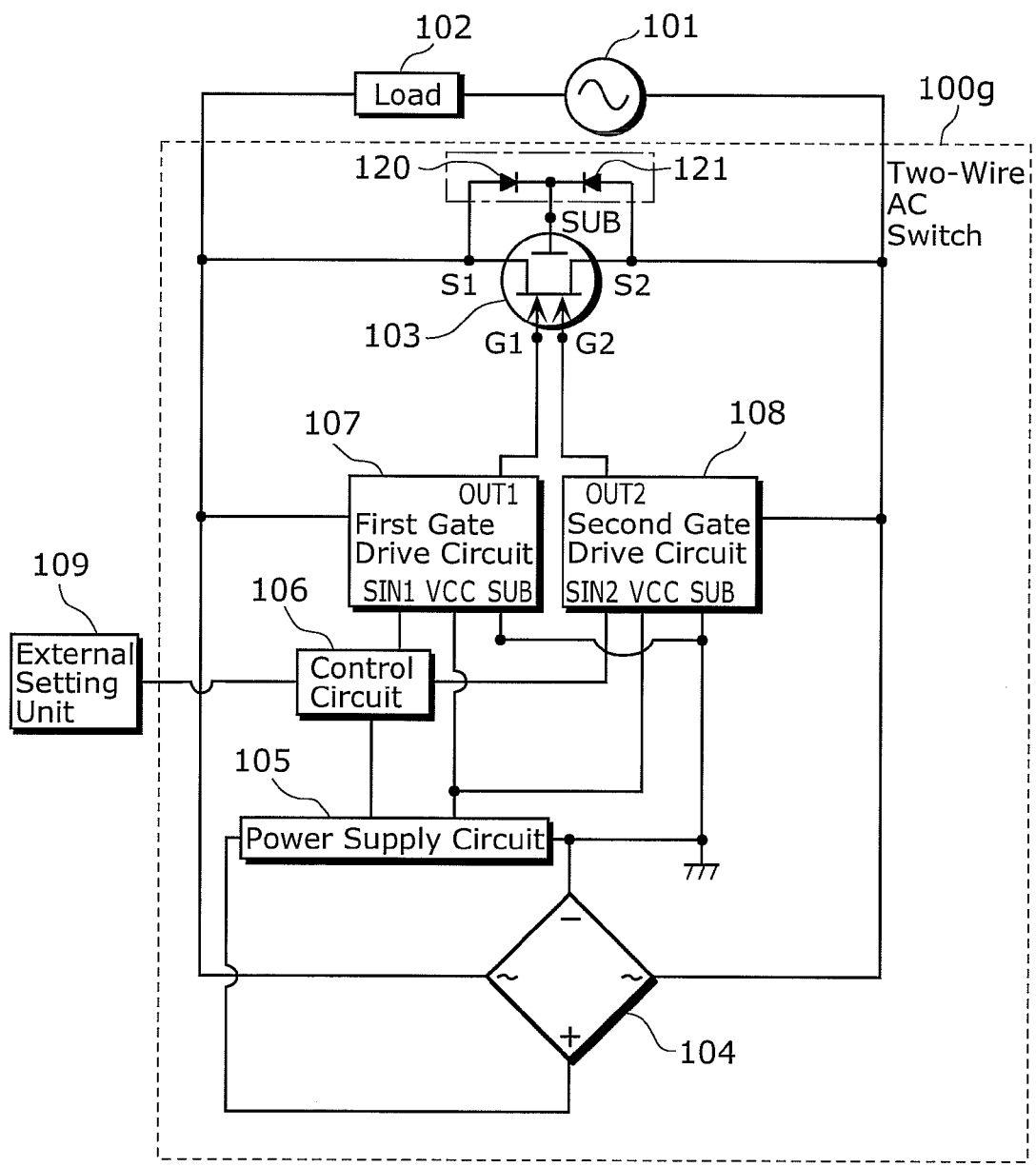
FIG. 11 is a circuit diagram of a two-wire AC switch including a bidirectional switch element having a substrate potential that is close to a higher one of the potentials of the commercial two-wire AC power supply, according to a seventh embodiment of the present invention.
Figure 12:
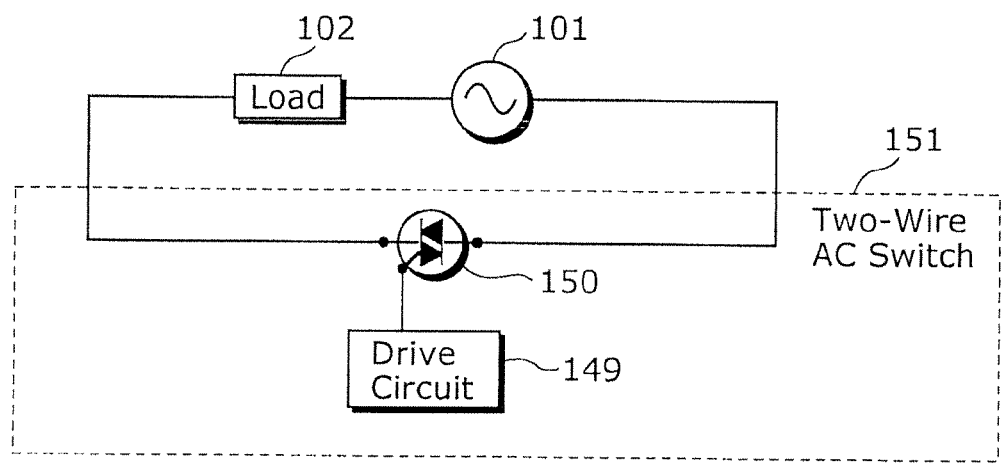
FIG. 12 is a circuit diagram of a conventional two-wire AC switch including a TRIAC.
Figure 13:
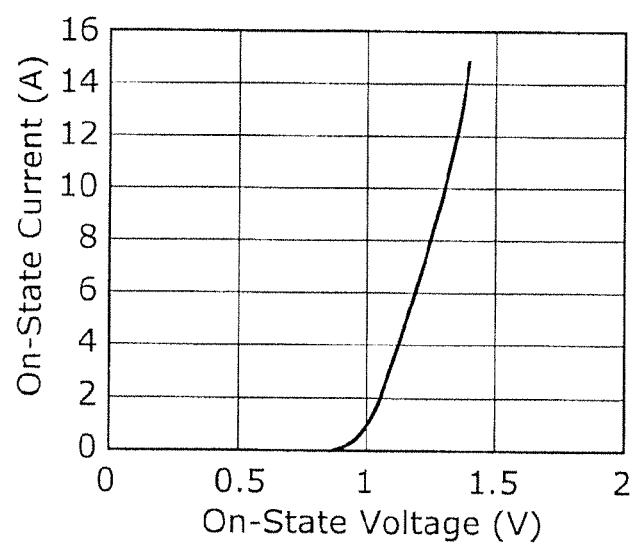
FIG. 13 is a graph plotting on-state characteristics of a TRIAC.

FIG. 11 is a diagram of a circuit structure of a two-wire AC switch 100g according to the seventh embodiment of the present invention. The two-wire AC switch 100g in FIG. 11 differs from the two-wire AC switch 100a in FIG. 1 in that the substrate terminal SUB of the bidirectional switch element 103 has a fixed potential that is close to a higher one of the potentials of the two-wire AC voltage. More specifically, in the example of FIG. 11, a diode 120 is connected between the substrate terminal SUB and switch terminal 51, and a diode 121 is connected between the substrate terminal SUB and the switch terminal S2. The above-described structure causes the substrate terminal SUB to have a fixed potential that is close to a higher one of the potentials of the two-wire AC voltage. The two-wire AC switch 100f having the structure can therefore perform stable control operations using the control terminal having a higher potential of the bidirectional switch element 103. It should be note that the method of fixing the potential of the substrate terminal SUB of the bidirectional switch element 103 to a potential that is close to a higher one of the potentials of the two-wire AC voltage may be any other methods.

As described above, each of the two-wire AC switches according to the above-described embodiments and variations uses the bidirectional switch element 103 made of a group-III nitride semiconductor in order to switch an AC power supply ON or OFF. Each of them can significantly reduce a loss caused by on-resistance of the bidirectional switch element much more than the conventional switches using TRIAC do. Thereby, each of the two-wire AC switches according to the above-described embodiments and variations can serve as a high-load AC switch to save power consumption, and perform stable switching operations for various loads.

Although only some exemplary embodiments and variations of the two-wire AC switch according to the present invention have been described in detail above, those skilled in the art will be readily appreciate that various modifications and combinations are possible in the exemplary embodiments and variations without materially departing from the novel teachings and advantages of the present invention. Accordingly, all such modifications and combinations are intended to be included within the scope of the present invention.

For example, in the above-described embodiments and variations, the bidirectional switch element 103 is a normally-off double-gate semiconductor device having two gate electrodes which are formed on p-type semiconductor layers (the first p-type semiconductor layer 125A and the second p-type semiconductor layer 125B). However, the structure of the gates of the bidirectional switch element according to the present invention is not limited to the above. For instance, the normally-off characteristics can be produced by forming gate recesses or by decreasing a thickness of the second semiconductor layer 129. More specifically, it is possible to form insulation layers instead of the p-type semiconductor layers under the respective gate electrodes, so as to form insulation gates. It is also possible to eliminate the p-type semiconductor layers under the gate electrodes, but to form a schottky junction between each gate electrode and the semiconductor multilayer structure so as to form junction gates.

In addition, depending on a circuit structure, the bidirectional switch element 103 may be a normally-on double-gate semiconductor.

Furthermore, although the substrate of the bidirectional switch element 103 has been described as the silicon substrate, the substrate of the present invention is not limited to this. The substrate may be any other substrate capable of forming a nitride semiconductor. The substrate may be made of silicon carbide (SiC), sapphire, or other material.

Industrial Applicability

The two-wire AC switch using the bidirectional switch element made of a group-III nitride semiconductor according to the present invention can reduce a loss caused by on-resistance of the bidirectional switch element much more than the conventional switches using TRIAC do. Therefore, the two-wire AC switch according to the present invention can serve as a high-load AC switch to save power consumption and perform stable switching operations for various loads. For example, the two-wire AC switch according to the present invention is suitable as a two-wire AC switch having a photochromic function which is used to control lighting apparatuses, ventilating fans, and the like in houses.

What is claimed is:

1. A two-wire AC switch connected between an AC power supply and a load, said two-wire AC switch comprising:
a bidirectional switch element connected in series with the AC power supply and the load to form a closed-loop circuit, said bidirectional switch element causing passing current to flow bi-directionally and selecting whether to flow or block the passing current,
wherein said bidirectional switch element includes:
a substrate;
a semiconductor multilayer structure formed above said substrate, said semiconductor multilayer structure including a group-III nitride semiconductor;
a first ohmic electrode and a second ohmic electrode which are formed above said semiconductor multilayer structure, said first ohmic electrode being electrically connected to one of the AC power supply and the load, and said second ohmic electrode being electrically connected to the other one of the AC power supply and the load; and
a first gate electrode and a second gate electrode which are formed above said semiconductor multilayer structure and between said first ohmic electrode and said second ohmic electrode, said first gate electrode being provided closer to said first ohmic electrode than to said second ohmic electrode, and said second gate electrode being provided closer to said second ohmic electrode than to said first ohmic electrode;
a full-wave rectifier connected between said first ohmic electrode and said second ohmic electrode to perform full-wave rectification on AC power supplied from the AC power supply, the AC power supply being included in the closed-loop circuit that includes the AC power supply, the load and the bidirectional switch element;
a power supply circuit which smoothes a voltage provided after the full-wave rectification by said full-wave rectifier to generate DC power;
a drive circuit which receives the DC power from said power supply circuit, and outputs a first control signal to said first gate electrode and a second control signal to said second gate electrode; and
a control circuit which receives the DC power from said power supply circuit, and controls said drive circuit to output the first control signal to said first gate electrode and the second control signal to said second gate electrode so as to turn said bidirectional switch element ON, so that the AC power supply supplies power to the load, the first control signal having a voltage higher than a threshold voltage of said first gate electrode, and the second control signal having a voltage higher than a threshold voltage of said second gate electrode, and
the AC power supplied from the AC power supply is provided to said bidirectional switch element without being converted to DC power.

2. The two-wire AC switch according to claim 1, wherein said bidirectional switch element is a normally-off switch element.

3. The two-wire AC switch according to claim 1, wherein said bidirectional switch element further includes:
a first semiconductor layer between said first gate electrode and said semiconductor multilayer structure, said first semiconductor layer forming a pn junction with said semiconductor multilayer structure; and
a second semiconductor layer between said second gate electrode and said semiconductor multilayer structure, said second semiconductor layer forming a pn junction with said semiconductor multilayer structure.

4. The two-wire AC switch according to claim 1, wherein said first gate electrode and said second gate electrode are electrodes of insulated gates.

5. The two-wire AC switch according to claim 1, wherein said first gate electrode forms a schottky junction with said semiconductor multilayer structure, and said second gate electrode forms another schottky junction with said semiconductor multilayer structure.

6. The two-wire AC switch according to claim 1, wherein said bidirectional switch element further includes:
a gate in ohmic contact with said first gate electrode; and
another gate in ohmic contact with said second gate electrode, each of the gate and the other gate including a group-III nitride semiconductor.

7. The two-wire AC switch according to claim 1, wherein said substrate is a silicon substrate.

8. The two-wire AC switch according to claim 1, wherein said substrate is a silicon carbide (SiC) substrate.

9. The two-wire AC switch according to claim 1, wherein said substrate is a sapphire substrate.

10. The two-wire AC switch according to claim 1, wherein said drive circuit outputs the first control signal to said first gate electrode via a resistance, and outputs the second control signal to said second gate electrode via a resistance.

11. The two-wire AC switch according to claim 1, wherein said drive circuit outputs the first control signal to said first gate electrode, and outputs the second control signal to said second gate electrode, and
each of the first control signal and the second control signal is one of current and constant current.

12. The two-wire AC switch according to claim 1, wherein said control circuit controls said drive circuit to (i) apply a voltage as a control signal to one of said first and second gate electrodes, the voltage being higher than the threshold voltage of the one of said first and second gate electrodes, the one of said first and second gate electrodes being close to one of said first and second ohmic electrodes which has a potential higher than a potential of the other, and (ii) apply, after applying the voltage, another voltage as a control signal to the other one of said first and second gate electrodes, the other voltage being higher than the threshold voltage of the other one of said first and second gate electrodes, so that said bidirectional switch element is turned ON.

13. The two-wire AC switch according to claim 1, wherein said substrate has a floating potential.

14. The two-wire AC switch according to claim 1, wherein said substrate is grounded.

15. The two-wire AC switch according to claim 1, wherein said substrate has a fixed potential.

16. The two-wire AC switch according to claim 1, further comprising:
a substrate terminal electrically connected to said substrate; and
two diodes connected in a direction in which passing current flows from said substrate terminal to said first ohmic electrode and said second ohmic electrode, one of said two diodes being connected between said substrate terminal and said first ohmic electrode, and the other one of said two diodes being connected between said substrate terminal and said second ohmic electrode.

17. The two-wire AC switch according to claim 1, further comprising:
- a substrate terminal electrically connected to said substrate; and
- two diodes connected in a direction in which passing current flows from said first ohmic electrode and said second ohmic electrode to said substrate terminal, one of said two diodes being connected between said substrate terminal and said first ohmic electrode, and the other one of said two diodes being connected between said substrate terminal and said second ohmic electrode.

18. The two-wire AC switch according to claim 1,
wherein the AC power supply is a commercial AC power supply,
the load is a lighting apparatus, and
said two-wire AC switch is connected between the commercial AC power supply and the lighting apparatus.

19. A bidirectional switch element comprising:
- a first terminal and a second terminal;
- a substrate;
- a semiconductor multilayer structure formed above the substrate, the semiconductor multilayer structure including a group-III nitride semiconductor;
- a first ohmic electrode and a second ohmic electrode which are formed above the semiconductor multilayer structure, the first ohmic electrode being electrically connected to the first terminal, and the second ohmic electrode being electrically connected to the second terminal; and
- a first gate electrode and a second gate electrode which are formed above the semiconductor multilayer structure and between the first ohmic electrode and the second ohmic electrode, the first gate electrode being provided closer to the first ohmic electrode than to the second ohmic electrode, and the second gate electrode being provided closer to the second ohmic electrode than to the first ohmic electrode;
- a full-wave rectifier connected between the first ohmic electrode and the second ohmic electrode and configured to perform full-wave rectification;
- a power supply circuit which smoothes a voltage provided after the full-wave rectification by the full-wave rectifier to generate DC power;
- a drive circuit which receives the DC power from the power supply circuit, and outputs a first control signal to the first gate electrode and a second control signal to the second gate electrode; and
- a control circuit which receives the DC power from the power supply circuit, and controls the drive circuit to output the first control signal to the first gate electrode and the second control signal to the second gate electrode, the first control signal having a voltage higher than a threshold voltage of the first gate electrode, and the second control signal having a voltage higher than a threshold voltage of the second gate electrode.

* * * * *